US006480014B1

(12) United States Patent
Li et al.

(10) Patent No.: US 6,480,014 B1
(45) Date of Patent: Nov. 12, 2002

(54) HIGH DENSITY, HIGH FREQUENCY MEMORY CHIP MODULES HAVING THERMAL MANAGEMENT STRUCTURES

(75) Inventors: Che-yu Li, Ithaca, NY (US); Thomas L. Sly, Cicero, NY (US); Weimin Shi, Ithaca, NY (US)

(73) Assignee: High Connection Density, Inc., Sunnyvale, CA (US)

( * ) Notice: Subject to any disclaimer, the term of this patent is extended or adjusted under 35 U.S.C. 154(b) by 23 days.

(21) Appl. No.: 09/781,089

(22) Filed: Jan. 12, 2001

Related U.S. Application Data

(62) Division of application No. 09/461,065, filed on Dec. 14, 1999.

(51) Int. Cl.[7] ............................................. G01R 31/02
(52) U.S. Cl. ..................................... 324/754; 324/158.1
(58) Field of Search ................................ 324/754, 760, 324/761, 755, 756, 762, 158.1; 439/52, 63, 82, 632, 825

(56) References Cited

U.S. PATENT DOCUMENTS

| | | | | |
|---|---|---|---|---|
| 5,801,924 A | * | 9/1998 | Salmonson | 361/719 |
| 6,275,559 B1 | * | 8/2001 | Ramani et al. | 378/4 |
| 6,304,082 B1 | * | 10/2001 | Gualtieri et al. | 324/252 |

* cited by examiner

Primary Examiner—Michael Sherry
Assistant Examiner—Minh N. Tang
(74) Attorney, Agent, or Firm—Salzman & Levy

(57) ABSTRACT

The present invention features an ultra high density, three-dimensional electronic circuit package suitable for constructing high capacity, high speed computer memory cards and the like. A demountable contact system allows easy test and/or burn-in. A memory card has a number of electrical receptacles adapted to receive a daughter card. The daughter card has memory devices attached to it and a corresponding number of electrical connectors placed along at least one edge, adapted to detachably mate with the electrical receptacles of the memory card. The demountable connectors allow easy rework of the module before optional, permanent solder attach. Bare dies or thin packages are mounted onto daughter cards, which in turn are mounted onto either a motherboard or memory card using pin/hole technology.

3 Claims, 6 Drawing Sheets

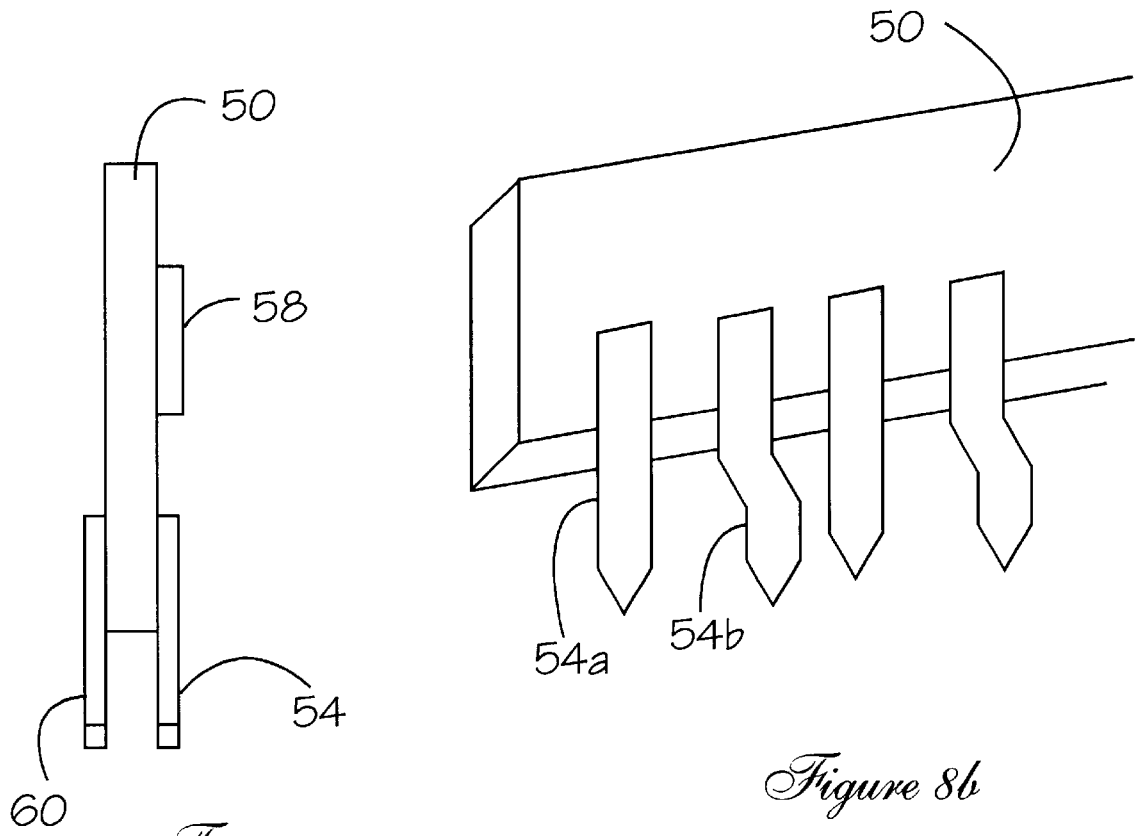
*Figure 8a*
*Figure 8b*
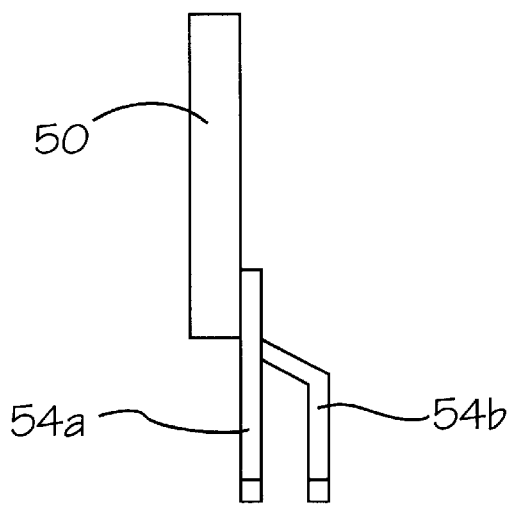
*Figure 8c*

US 6,480,014 B1

HIGH DENSITY, HIGH FREQUENCY MEMORY CHIP MODULES HAVING THERMAL MANAGEMENT STRUCTURES

RELATED PATENT APPLICATION

This application is a divisional of U.S. patent application Ser. No. 09/461,065 filed Dec. 14, 1999.

This application is related to U.S. Pat. No. 5,928,005, issued to Li et al. for SELF-ASSEMBLED LOW INSERTION FORCE CONNECTOR ASSEMBLY and U.S. Pat. No. 6,172,895, issued to Brown et al. for HIGH CAPACITY MEMORY MODULE WITH BUILT-IN-HIGH-SPEED BUS TERMINATIONS; and copending U.S. patent application Ser. No. 09/461,064, now abandoned, all of which are hereby incorporated by reference.

FIELD OF THE INVENTION

The present invention relates to high density electronic memory components and packages and, more particularly, to an ultra high density memory package featuring demountable memory chips and integrated thermal management features.

BACKGROUND OF THE INVENTION

In semiconductor devices, operating efficiency is one of the ultimate benchmarks of performance. Electrical signals are switched on and off relative to a particular voltage level within these devices, resulting in patterns which are considered "data". One measure of operating efficiency, therefore, is the voltage required to operate the semiconductor device. Because electrical power is proportional to the square of the voltage, the lower the voltage, the less power must be dissipated as heat.

Another benchmark of performance for semiconductor devices is operating speed. In other words, performance gains may be achieved by operating switching devices at increased switching speed, generally referred to as clock rate (i.e., the speed of switching of the electrical signal by which other signals are synchronized). Clock rates, in turn, are dependent on semiconductor fabrication processing techniques. Moreover, increased clock rates generally also result in increased operating temperatures due to the physics of electron motion.

At high clock speeds, signal integrity may be affected largely by the electric noise, due mostly to inductive and capacitive coupling effects that lead to signal reflection, distortion and delay. Inductance and capacitance may be controlled by suitably located ground planes. For example, a stripline configuration or a pin grid array (PGA) connector with grounded pins around the signal pin can be used. More specifically, to reduce signal reflection, the impedance along the signal path must be matched (e.g., to 28 ohms) as is the present practice in most sophisticated circuits on printed circuit boards (PCBs). Also, to control the signal delay, signal path lengths should be matched so that signals to different memory chips arrive in phase (at the same time).

In the area of electronic packaging, high speed semiconductor devices are interconnected one to another by the shortest possible signal path to minimize signal delays and thereby increase overall system performance. Such is the case with memory devices placed near one or more processing or logic units (processors or CPUs).

The amount of memory available to a processor is limited practically, however, by the capacity of the memory device and the density with which multiple memory devices can be stacked together in close proximity to the processor. By increasing both clock frequency and stacking density of the memory chips, system performance may be improved (i.e., speed increased), but with the aforementioned, detrimental result: more heat is generated. The heat problem, as well as the noise problem, are exacerbated by the fact that the heat-generating devices are now packaged in relatively smaller confines. More heat is generated, and the signal quality becomes an issue because of greater concern for signal noise and delays as clock/bus speeds increase.

Therefore, it is the goal of high performance package designs to maximize packing density while providing effective thermal management. Widely accepted practices for achieving these goals are to miniaturize package sizes and thicknesses or profiles. Commonly used forms include thin, small-outline packages (TSOPs), chip-scale packages (CSPs), and chip-on-board (COB) structures. Decreasing package size allows for both shorter signal lengths as well as shorter thermal paths. The chip packages are generally mounted flush and one-high onto a PCB. This layout practice provides the lowest profile, but unfortunately also dictates low packing density.

One implementation of highly dense memory is the dual inline memory module (DIMM). The DIMM is constructed by soldering TSOP devices onto one or both sides of a length of memory circuit board. Electrical contacts along an edge of the circuit board allow mounting the DIMM circuit board in a mating socket, generally perpendicular to the surface of a motherboard. The TSOPs are thereby aligned into a maximum configuration of eight or nine packages on either side of the DIMM, for a total of sixteen to eighteen packages, hard-soldered to the DIMM circuit board.

The relatively long wire bonds of the TSOPs, however, cause high levels of inductance, which results in crosstalk and signal delays. Both crosstalk and signal delays may severely limit performance at high frequencies. While the DIMM itself is socketable, which allows for upgrading when desired, individual TSOP modules require hot rework if a device fails.

DIMMs can be considered natural heat fins, but cooling efficiency is low due to the lack of an effective thermal transfer medium from the die to the air, and the lack of a short air channel in the direction of air flow (i.e., parallel to the motherboard), exacerbated by the size of the DIMM when placed next to another DIMM.

The RAMBUS® inline memory module (RIMM) is similar to the DIMM. A high density implementation using RIMMs has been proposed by Nippon Electric Company (NEC). The primary advantage of the RIMM implementation over DIMM is that the RIMM has been specifically designed for high frequency operation. In the NEC Concurrent RAMBUS approach, the edge of a thin, edge-leaded package is surface-mounted onto a DIMM-like structure. Many of these edge packages may be mounted in this manner, creating a stack of discrete packages.

While the maximum operating frequency of DIMM modules has been limited to relatively low frequencies, a RIMM module may be operated at much higher speeds to be compatible with the high CPU operating speeds currently employed in leading edge workstations and servers. However, inherent deficiencies in the present RIMM implementation do not allow for impedance matching memory chips to the memory bus, effectively controlling noise, or controlling signal propagation delay.

Soldered connections are limited by processing conditions of surface mount devices. The edge leads require relatively large interlead spacing to allow reliable soldering to the board. While an intermediate interconnect layer is not present (the pad serves as the interconnect), it is still necessary to mount (reflow) all of the devices simultaneously. The structure does not provide an adequate thermal solution because it does not allow for efficient airflow or thermal dissipation. Neither does it allow for simple rework, as the small intermodule spacing complicates processes for applying heat in order to rework the vertical package.

DISCUSSION OF THE RELATED ART

U.S. Pat. No. 5,572,065 for HERMETICALLY SEALED CERAMIC INTEGRATED CIRCUIT HEAT DISSIPATING PACKAGE; issued Nov. 5, 1999 to Carmen D. Burns, describes methods by which packages similar in form to TSOPs can be fabricated and mounted atop one another to achieve higher packing density and to dissipate heat. Designs such as described by Burns show that a silicon chip can be lapped thin, stacked on a thermally conductive lead frame, and electrically connected with rails at common sites, resulting in a stacked package that can be permanently bonded to a PCB (i.e., a motherboard or an add-on board). While such an approach can pack chips at a higher density, it results in a packaging structure inherently expensive and difficult to rework, should any portion of the aggregate device fail to work properly. The primary means for heat removal is inefficient and relies on thermal conduction through the body of the stack into a thermal slug or sink. Most importantly, these stacked memory devices cannot easily or inexpensively be adapted for high frequency operation which would require controlling electrical noise, impedance matching and signal delay matching (skew minimization).

In contradistinction, the high density circuit package of the present invention provides both an extremely high packaging density and efficient thermal management structure. The high density package allows short interconnection lengths both within a module and among modules in the package and to the card or board onto which the module is connected. The inventive connector permits signal lines leaving and entering the package to be disposed extremely close together.

U.S. Pat. No. 5,367,766 for ULTRA HIGH DENSITY INTEGRATED CIRCUIT PACKAGES METHOD; issued Nov. 29, 1994 to Carmen D. Burns, et al., discloses an integrated circuit package whose conduction rails also function as heat fin structures to radiate heat generated within the package. However, the limited contact area of the fins with the thermal paths precludes effective convective heat transfer.

On the other hand, the thermal management structures of the inventive package are designed to optimize both thermal conduction and radiation, allowing for maximum circuit density without heat build-up, which could degrade module performance.

In U.S. Pat. No. 5,566,051; issued Oct. 15, 1996 to Carmen D. Burns, a lead frame itself is utilized as a thermal structure that can be placed in contact with a heat sink. This design also suffers from a limited thermal path, further interrupted by perforations in the frame that are necessary to reduce thermal stress.

The thermal structures of the inventive package provide both thermal paths and radiating surfaces, which are optimized for both thermal conduction and radiation, permitting maximum circuit density while controlling heat build-up in the module.

None of the aforementioned prior art structures provides for high frequency operation with structures such as signal lines, ground planes, dielectrics, connectors, etc. specifically included to reduce signal noise and delay, or to control signal path impedance. Neither do these prior art structures provide for reliable thermal management of a stacked, integrated circuit module because they each require a second level of interconnect between the singular devices making up the module stack and the PCB on which the stack is mounted. Variations or flaws in the intermediate interconnect layer may drastically affect electrical and mechanical reliability as more devices are added to the stack.

In addition, efficient and effective thermal conduction becomes even more crucial as heat is added to the stacked system, which already has narrow thermal paths. The final stack structure requires hot processing temperatures and extremely careful techniques, making both assembly and rework very expensive.

Nothing in the aforementioned prior art references or any other prior art known to the present inventors is seen to teach or suggest the high-density, thermally-managed packaging structure of the instant invention.

It is, therefore, an object of the invention to provide an extremely high density module interconnection package.

It is another object of the invention to provide a memory module optimized for high frequency operation with specific structures for controlling impedance, controlling signal delays and reducing electrical noise.

It is a further object of the invention to provide a packaging structure having integrated thermal management structure to effectively maintain a reasonable operating temperature within the packaging structure.

It is yet another object of the invention to provide such a packaging structure with integrated thermal management in a low profile configuration.

It is an additional object of the invention to provide a high density module packaging structure wherein individual modules may be temporarily interconnected for testing.

It is yet another object of the invention to provide a high density module package wherein individual modules may be permanently interconnected after testing indicates that all modules are functional.

It is still another object of the invention to provide a high density circuit module package wherein module rework may be easily and inexpensively performed without excessive exposure of modules to damage by heat or handling during rework.

It is yet another object of the invention to provide a high density circuit module package wherein electrical connectors both on daughter cards within the module and external to the module minimize electrical inductance to provide stable high frequency performance.

SUMMARY OF THE INVENTION

The present invention features an ultra high density, three-dimensional electronic circuit package suitable for constructing high capacity, high speed computer memory cards and the like. A high density connector system allows narrow contact-to-contact spacing, thereby permitting more discrete electrical connections within a given space than have heretofore been available. The small physical size of the contact system minimizes inductance and crosstalk, both on daughter cards carrying the memory devices as well as on the memory board, thus making the inventive packaging system suitable for high speed/high frequency applications.

In particular, the daughter cards carrying the actual memory devices may be equipped with structures such as ground planes, etc. to minimize electrical noise and control impedances, thereby maintaining signal synchronization (i.e., controlling skew). In addition, the novel, demountable contact system allows easy test and/or burn-in.

A memory card has a number of electrical receptacles adapted to receive a daughter card. The daughter card has memory devices attached to it and a corresponding number of electrical connectors placed along at least one edge, adapted to detachably mate with the electrical receptacles of the memory card. These electrical connectors play a critical role in the high frequency-optimized design wherein impedance is controlled and electrical noise minimized. The demountable connectors also allow easy rework of the module before optional, permanent solder attach.

A number of implementations are disclosed that minimize packing space, while maximizing thermal efficiency. The inventive module may accommodate bare dies or variations of thin packages such as TSOPs, CSPs, COBs, etc., described hereinabove and/or well known to those skilled in the circuit packaging art. These dies or packages are mounted onto daughter cards, which in turn are mounted onto either a motherboard or memory card using pin/hole technology.

BRIEF DESCRIPTION OF THE DRAWINGS

A complete understanding of the present invention may be obtained by reference to the accompanying drawings, when taken in conjunction with the detail description thereof and in which:

FIG. 8a is a schematic view illustrating pin attachment to both sides of a daughter board;

FIG. 8b is a schematic, front plan view of a bent pin attachment;

FIG. 8c is a side schematic view of the bent pin attachment shown in FIG. 8a;

FIG. 10 is a front schematic view of the external ground plane shown in FIG. 8a.

DETAILED DESCRIPTION OF THE PREFERRED EMBODIMENT

Generally speaking, the invention is an ultra high density, three-dimensional electronic circuit package suitable for constructing high capacity, high frequency, high speed computer memory cards and the like. A demountable contact system allows easy test and/or burn-in. A memory card has a number of electrical receptacles adapted to receive at least one daughter card. The daughter card has memory devices attached to it and a corresponding number of electrical connectors placed along at least one edge, adapted to detachably mate with the electrical receptacles of the memory card. The demountable connectors allow easy rework of the module before optional, permanent solder attach. Bare dies or thin packages are mounted onto daughter cards, which in turn are mounted onto either a motherboard or memory card using pin/hole technology. The inclusion of both strategically placed ground and/or power planes for impedance control and noise reduction allows the design of modules which operate reliably at high bus/clock speeds. Thermal structures within the module control temperatures, even in the densely-packed structure of the invention.

Figure 1A:
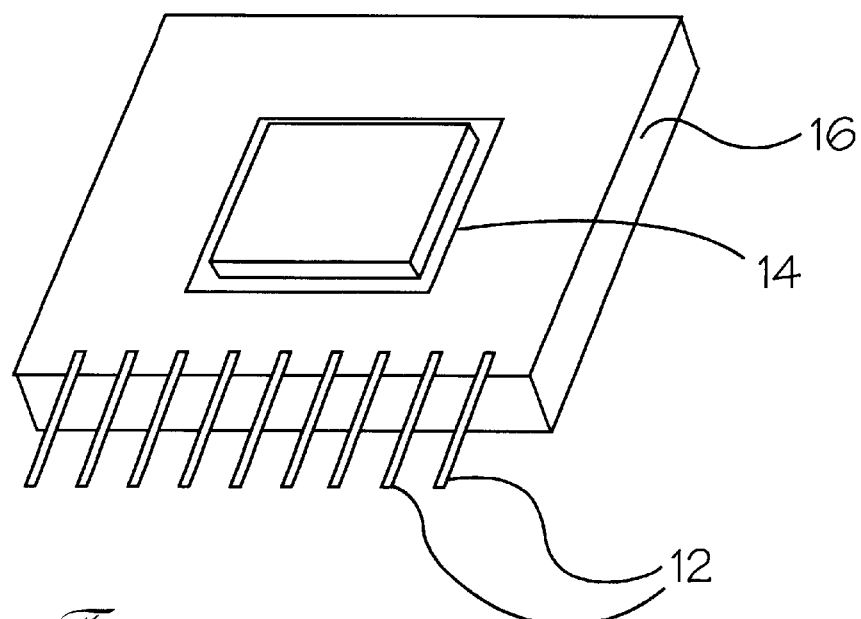
FIG. 1a is a schematic view showing a CSP mounted on a daughter card.
Figure 1B:
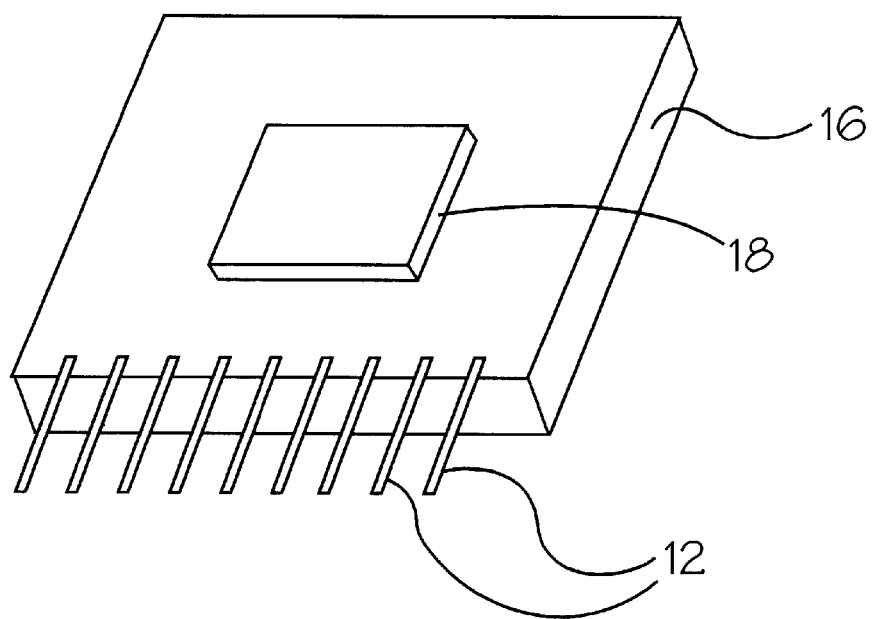
FIG. 1b is a schematic view showing a silicon chip mounted directly on a daughter card.

Referring first to FIGS. 1a and 1b, there are shown two possible module constructions. FIG. 1a shows a chip scale package (CSP) 14 mounted to a small daughter card 16. A variety of attachment techniques well known to those skilled in the art may be used for attaching the CSP 14 to the card 16. Leads 12 facilitate electrical connection of the chip 14 to a chip carrier, daughter board 16, or the like.

FIG. 1b shows a silicon chip 18 mounted directly on a small daughter card 16. A variety of chip attachment techniques may be used, such as flip-chip (both solder and adhesive bond), conventional surface mount and wire bonding, as well as other techniques also well known to those skilled in the art. Once again, leads 12 facilitate electrical connection of the chip 18 to a chip carrier, daughter board 16, or the like.

The daughter cards 16 are generally composed of PCB materials such as an epoxy-glass such as FR-4 for matching the coefficient of thermal expansion (CTE) of the daughter card 16 to the motherboard and to conductive layers of material such as copper or copper alloy for signal, power and ground planes. In high frequency applications, other dielectric materials may be used, such at tetrafluoroethylene (TFE) and polyimide or other materials also known to those skilled in the art. The chips 14 and 18 may be bonded using C3 reflowed solder or, optionally, by wire bonding the chip 14 and 18 to the daughter board 16. Pins 12 may be formed in a variety of ways including: molding, etching, stamping, rolling, or otherwise forming.

It should be understood that these two examples are by no means exhaustive; other methods for packaging module chips may also be employed to fit a particular operating circumstance or environment.

A preferred embodiment entails flip-chip bonding a bare die for RAMBUS® memory architecture to a daughter card. The short connections of the instant invention replace the longer, traditional wire bonds of other CSP and TSOP packages. These short connections greatly reduce inductance and therefore reduce electrical parasitics such as crosstalk. Since parasitic effects limit the frequency at which modules perform reliably without error, high frequency performance is improved by these reduced connection lengths.

Parasitics may also be reduced by substituting striplines for microstrips when possible in the daughter card and in the RIMM modules themselves. Bonding a bare die directly to a daughter card creates an efficient chip-carrying package. In addition to the advantage of reducing parasitics, the bare die has a lower profile (height) than does a die already in a package, enabling higher density daughter card stacks.

The inventive memory module may also contain thermal management structures contacting the chips, which conduct heat away from the chip. Such structures may be constructed by interleaving heat-spreading fins between the individual chip components and/or daughter boards. These fins may be made from materials that are both thermally tailored to the device package and shaped to decouple the expansion of the silicon device from the stacking direction of the finished package. The construction of the memory module, including thermal management structures, is described in detail hereinbelow.

The inventive contact systems in the RIMM module board or motherboard may be located either at the top or bottom of the board, and can be used for either temporary connection during testing of the RIMM, or for permanent attachment. If the connection is temporary, permanent attachment may be made after testing. This is done by soldering at the connection itself, if it is on the bottom of the board, with the pin still through the plated through hole (PTH) or the bare hole. If the hole is bare, blind vias are used as conductors to inner layers.

Permanent attachment of the daughter cards to the memory board may be made after testing by soldering the pins of the daughter cards into the memory card. This works well since the holes in the memory card are plated through holes and the solder readily wicks up the pins forming a good mechanical and electrical connection between the pin and the plating of the hole. Even if the pins do not extend beyond the surface of the memory card (i.e., the pins are not fully inserted in the holes), this technique is generally successful because of the ability of solder to wick up the plated through hole.

If C4 connectors, completely described in our U.S. Pat. No. 5,298,005, or if zero insertion force (ZIF) connectors are used for the permanent connection, and multiple re-mounts into the hole are possible, the connection will resist delamination at demount time much better if the hole is a PTH. This is due to the fact that the plating acts as a reinforcement to the lamination of the top metal layer forming the connection.

The PTHs can either be plated along their entire length, or partially plated as the connector is located at the pin-insertion side of the card or board, either at the top or at the bottom of the board, since the purpose of the plating is to reinforce the lamination. If bare holes are used, blind vias may provide connection to the inner layers of the board or card. Reducing or eliminating the plating of the holes reduces the capacitance between the holes.

Figure 2:
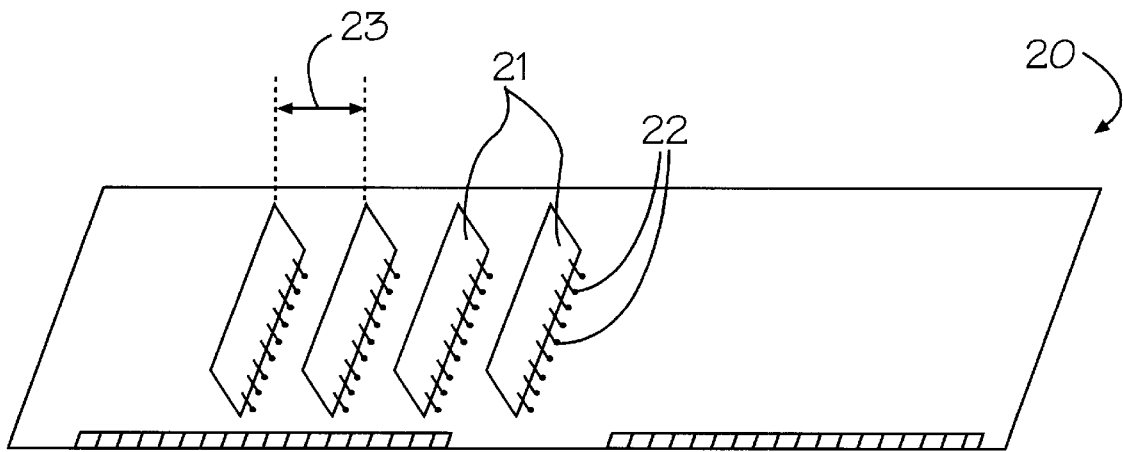
FIG. 2 is a schematic view of a memory module having a plurality of chips mounted via pluggable contacts perpendicular to the memory module surface.

Referring now also to FIG. 2, there is shown a memory module 20 equipped with embedded contact holes 22 adapted to receive pins 12 from the devices shown in FIGS. 1a and 1b. Pins 12 allow each of the these packages to be inserted perpendicularly into embedded connection holes 22 in a memory module 20 or into a motherboard (not shown).

Memory module 20 may be inserted into a slot perpendicular to a system board (not shown) or other receiving structure. Unlike standard surface mounting, the size of the C4 or ZIF receptacle is substantially the same as the thickness of the pins 12; it therefore appears as an ultra-narrow zone on pitch 23 of daughter cards 21 between pins 12 and embedded contact holes 22, the zone being no wider in profile than the package. The packing density is therefore not limited by the interconnect size. Any package that has pins meeting the C4 or ZIF requirements can be inserted at maximum density.

Figure 3A:
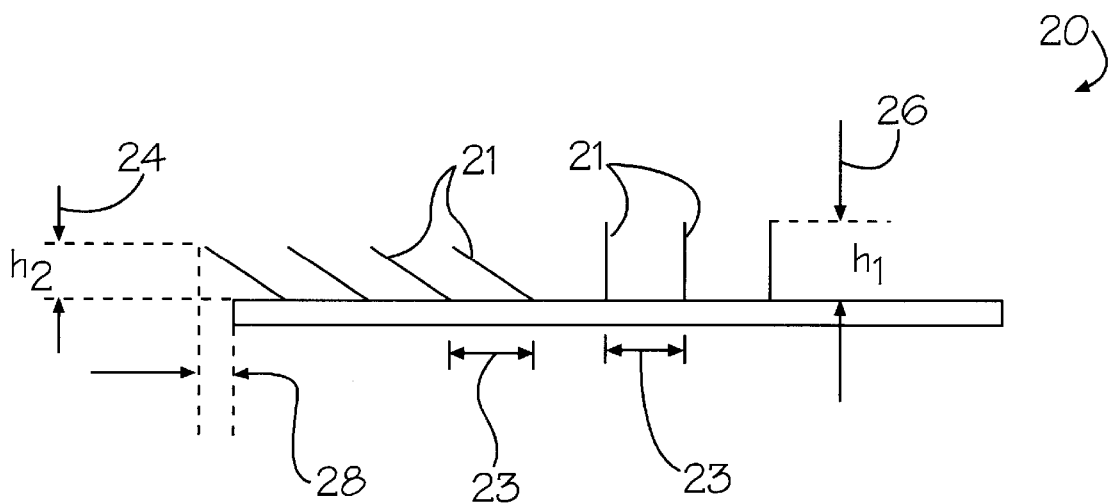
FIG. 3a is a side, schematic view of a memory module showing chips attached in both a perpendicular and an angular arrangement.

Referring now also to FIG. 3a, there is shown a schematic, side view of a memory module 20. Height profile 24 is lower than height profile 26 for perpendicular modules. The lower profile 24 is achieved by bending the pins 12 either before or after insertion. An increase 28 in the overall length of module 20 compensates for the decrease in profile.

Figure 3B:
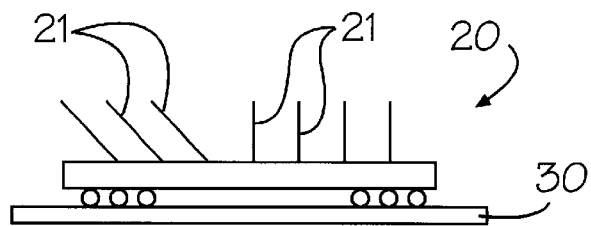
FIG. 3b is a schematic view of an alternate attachment means using ball grid array (BGA)

Referring now also to FIG. 3b, although module 20 may be inserted into a slot (not shown) perpendicular to the motherboard 30, the module 20 may also be area-attached to the system board 30 using BGA, pin/hole, or land grid array solderless compressible connectors. Bending the pins 12 (FIG. 1a) decreases the profile, enabling ultra-high density memory in low profile devices, such as notebook computers, that have previously been limited in memory.

The second level interconnect devices or interposers (not shown) of the prior art are no longer needed because the pin/hole C3, or ZIF, or optionally soldered connections are low-resistance connections. Because the connector is part of the PTH of the board or card itself, the resulting short connections and short signal paths provide higher performance. By using the inventive C3 or ZIF contact structures, electronic products can be reworked easily, owing to individual demountability.

Figure 4:
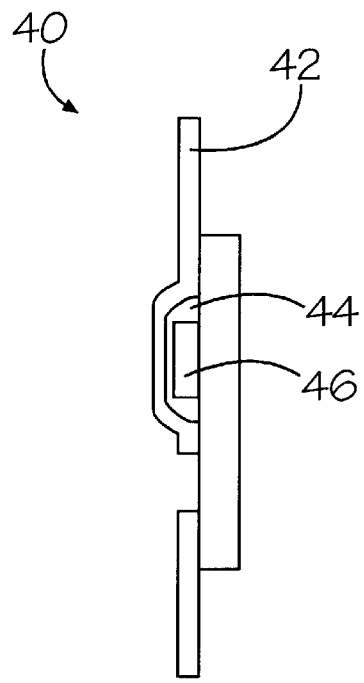
FIG. 4 is a cross-sectional, schematic view of a memory module incorporating a thermal management structure.

Referring now to FIG. 4, there is shown a cross-sectional, schematic view of a daughter card (memory module) 40 incorporating a thermal management structure such as a heat spreader or fin 42. Individual memory devices 46, in any side-mounted form, can have a specially-shaped thermal path or heat spreading fin 42 mounted permanently or non-permanently to its surface. A physically conformal, heat-conducting material 44 may be placed between the heat spreader 42 and either or both of the memory devices 46 to increase the area of the thermal path between the device 46 and the spreader 42. The shaping of this material is important, though easily controlled. Its thickness is very small and uniform, so that a stack of devices interleaved with heat spreaders 42 can have very good dimensional uniformity, and thereby act as spacers between adjacent daughter cards 40.

Figure 5:
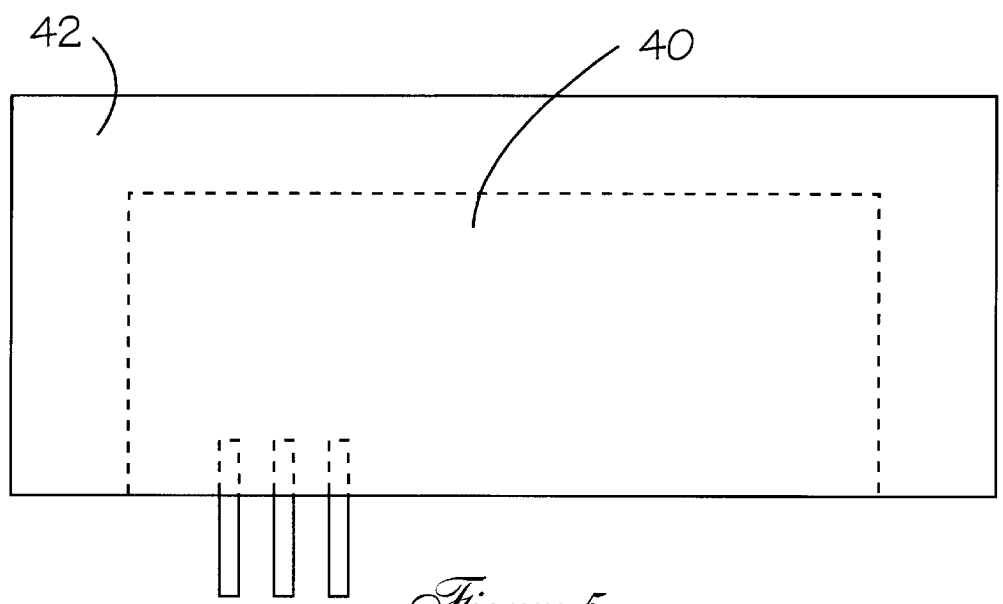
FIG. 5 is a schematic view of a heat slug embedded in a daughter card.

Referring now to FIG. 5, there is shown a front plan view of the daughter card 40 shown in FIG. 4. Heat spreader 42 may extend beyond any combination of three edges of daughter card substrate 16 as may be required for a good thermal design.

Figure 6:
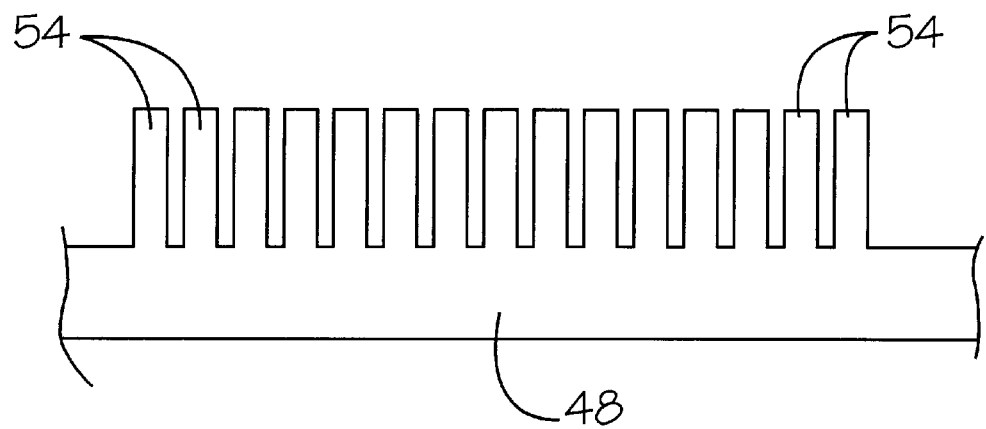
FIG. 6 is a schematic view illustrating a preferred method for attaching pins to a daughter frame utilizing lead frame technology.
Figure 7:
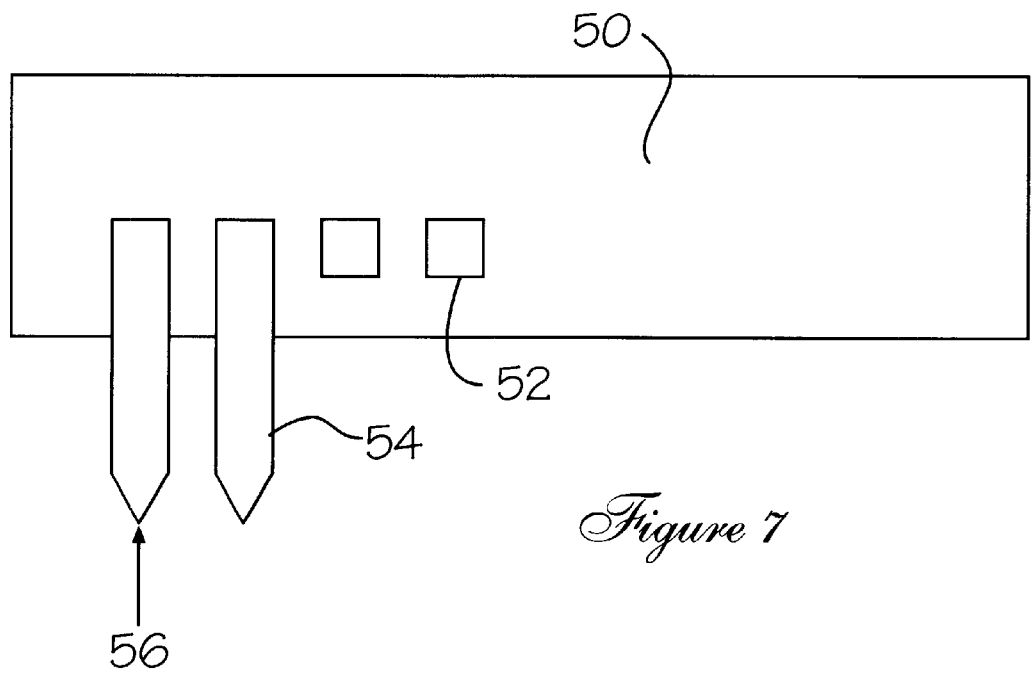
FIG. 7 is a schematic view showing pin attachment to a daughter card.

Referring now to FIG. 6, there is shown a preferred method of attaching the pins 54 to the daughter card 50 (FIG. 7). Pins 54 for attachment to a daughter card 50 are first stamped, etched, molded, or otherwise formed, with one end left attached to lead (handling) frame 48 by readily separable tabs.

Referring now also to FIG. 7, the pins 54 in the frame 48 (FIG. 6) are next placed onto the pads 52 of the daughter card 50 with solder paste (not shown) either on the pins 54 or on the pads 52. The pins 54 are then arc reflow-attached to the pads 52. After removal of the frame 48, the pins 54 remain attached to the daughter card 50. Pins 54 can have a slight point or taper 56, in order to make better connection with holes of greater tolerance.

Referring now to FIGS. 8a, 8b and 8c, pins 54 and 60 can optionally be mounted on respective sides of the daughter card 50. Pins 54 may be staggered, some pins 54b being bent away from the daughter card 50, while other pins 54a remain unbent. While a pattern of alternating straight and bent pins 54a and 54b is depicted, many other patterns of bent/straight pins may be utilized to meet a particular operating condition or circumstance. Both approaches of pins 54 and 60 (i.e., pins on both sides of daughter card 50, and bending certain pins 54b) allow the pins 54, 54a, 54b and mating holes (not shown) to be separated by greater distances, thereby reducing electrical parasitic effects.

The chip or chip package 58 may be attached to the daughter card 50 either simultaneously with, before, or after pin attach, depending on the low/high temperature solder hierarchy (e.g., if solder is used instead of optional wire bond or surface mount techniques).

Figure 9:
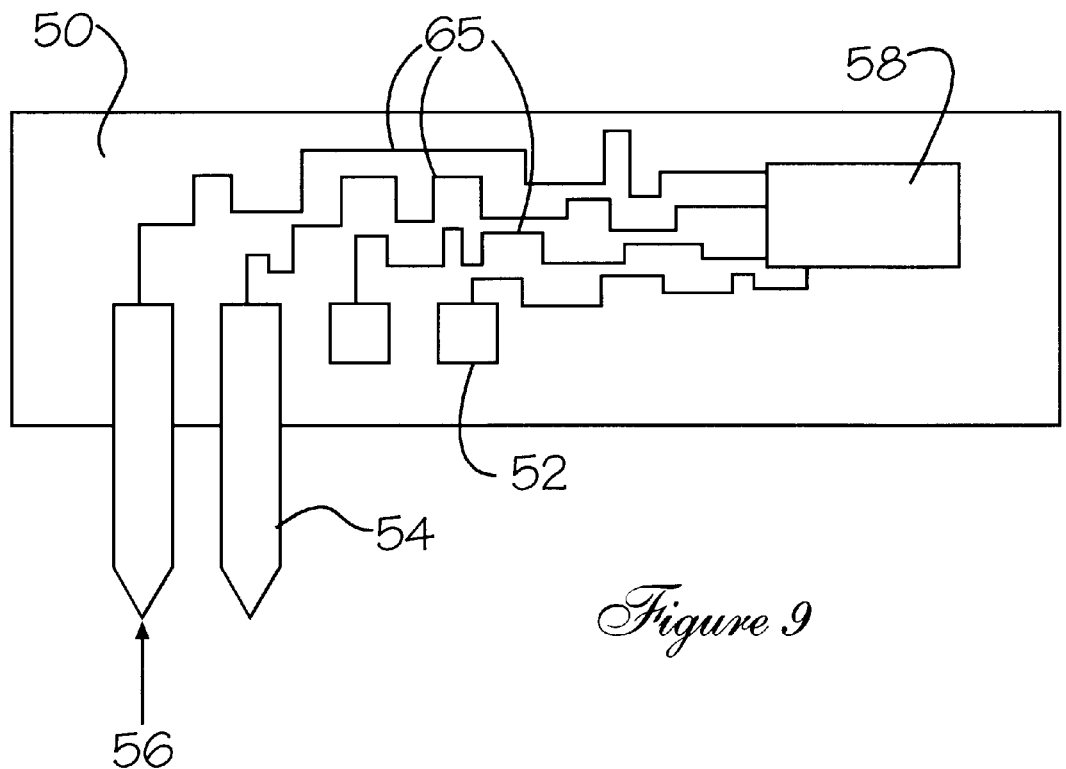
FIG. 9 is a schematic view of a daughter card with a memory chip and wiring traces.

Referring now to FIG. 9, daughter card 50 is shown with a mounted chip or chip carrier 58. Signal traces 65 may be on either external or internal layers (not shown).

Figure 10:
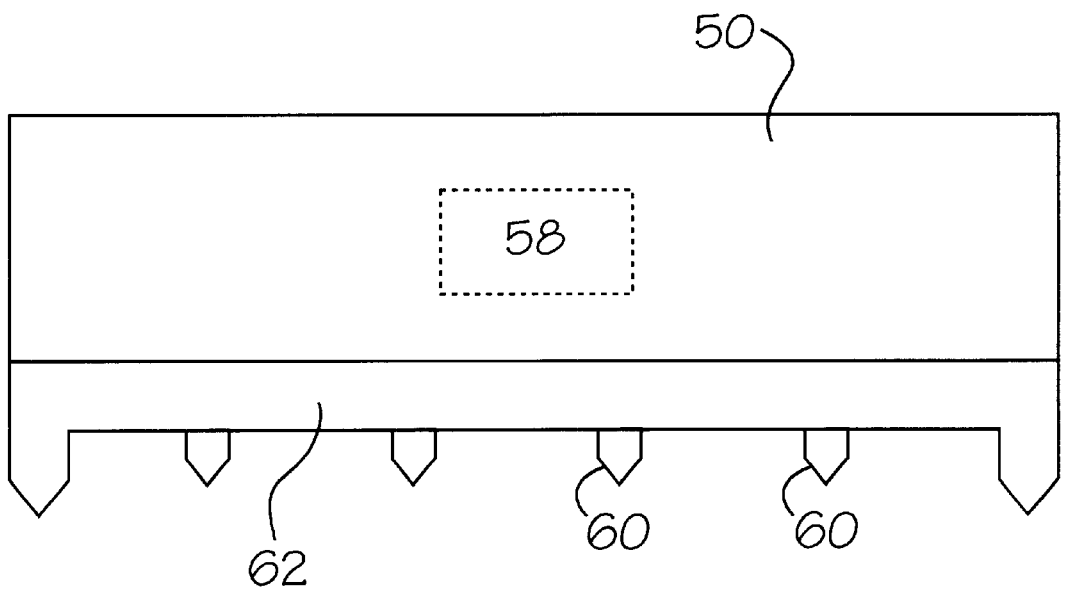

Referring now to FIG. 10, there is shown a daughter card 50 having an additional ground or power plane 62 and associated connecting pins 60. This configuration is also shown in FIG. 8a. Electrical parasitic effects may be reduced by a ground or power plane 62 adjacent or attached to the daughter card 50. In particular, such a ground 62 can modify pin/pin fields for the portions of the pins 54 (FIG. 9) in air between the daughter card 50 and the receiving module board (not shown).

Daughter cards 50, with or without chips or chip packages 58, may be used to move part of a manifest of traces on the memory card to the daughter card, freeing area on the memory card. A benefit of this innovative high density structure is that electrical terminators (not shown) may be moved from the motherboard onto the daughter card or memory card, making the module truly self-contained, simplifying the motherboard. These self-contained terminators are the subject of the aforementioned U.S. Pat. No. 6,172,895.

An immediate benefit of the inventive memory module may be seen by examining the currently emerging RAMBUS memory architecture. Conventional RAMBUS configuration is usually implemented on up to three RIMM cards, each containing eight or sixteen chips. The high-density memory package of the instant invention allows placement of thirty-two chips per RIMM, so that potentially two to four times as much memory may occupy the same area on the motherboard. This lowers memory cost and provides a new upper limit for the amount of memory which may be provided on a motherboard.

Since other modifications and changes varied to fit particular operating requirements and environments will be apparent to those skilled in the art, this invention is not considered limited to the example chosen for purposes of this disclosure, and covers all changes and modifications which does not constitute departures from the true spirit and scope of this invention.

Having thus described the invention, what is desired to be protected by Letters Patent is presented in the subsequently appended claims.

What is claimed is:

1. A method for assembling a high-density memory module, the steps comprising:
    a) attaching a plurality of memory devices to at least one daughter card having a plurality of pins along at least one edge thereof, said pins being respectively and operatively connected to said plurality of memory devices;
    b) providing a memory board having a plurality of plated through holes adapted to detachably receive and retain said plurality of pins therein, said pins thereby providing substantially all retentive forces needed to releasably retain said daughter card to said memory board;
    c) after said attaching step (a), testing each of said at least one daughter card connected to said memory board;
    d) detaching and replacing any daughter card failing said test performed in step (c);
    e) retesting said replaced daughter card; and
    f) repeating said detaching and rep lacing step (d) and said retesting step (e) until a completely functional memory module is obtained.

2. The method for assembling a high-density memory module as recited in claim 1, the steps further comprising:
    g) soldering said at least one daughter card to said memory board upon successful completion of said testing step (c) and retesting step (e).

3. The method for assembling a high-density memory module as recited in claim 2, the steps further comprising:
    h) placing at least one heat transfer means between predetermined ones of said daughter cards.

* * * * *